United States Patent [19]
Yasuda et al.

[11] Patent Number: 4,601,841
[45] Date of Patent: Jul. 22, 1986

[54] FERROELECTRIC CERAMIC COMPOSITION

[75] Inventors: Goichi Yasuda, Tokyo; Rika Noguchi, Abiko; Yoichi Tanaka, Funabashi, all of Japan

[73] Assignee: TDK Corporation, Tokyo, Japan

[21] Appl. No.: 710,134

[22] Filed: Mar. 11, 1985

[30] Foreign Application Priority Data

Mar. 12, 1984 [JP] Japan ................................. 59-46843

[51] Int. Cl.$^4$ ............................................. C04B 35/46
[52] U.S. Cl. ..................................... 252/62.9; 501/136
[58] Field of Search ........................ 252/62.9; 501/136

[56] References Cited

U.S. PATENT DOCUMENTS 4,073,846  2/1978  Masumura et al. .................. 501/136

Primary Examiner—Mark L. Bell
Attorney, Agent, or Firm—Wyatt, Gerber, Shoup, Scobey and Badie

[57] ABSTRACT

The invention provides a ferroelectric ceramic body useful as a piezoelectric device having excellent dielectric, piezoelectric and temperature characteristics along with good sinterability. The ceramic material has a chemical composition represented by the formula $$(1-x-y)Pb_\alpha TiO_3 \cdot xBi_{2/3\beta}TiO_3 \cdot yCaTiO_3,$$

in which x is 0.005 to 0.30, y is 0.01 to 0.35, $\alpha$ is 0.95 to 1.02 and $\beta$ is 0.95 to 1.05 and the titanium atoms are partially replaced with manganese atoms and/or niobium atoms in such a degree of substitution that the amounts of the manganese atoms and niobium atoms are each, independently from the other, from 0.5 to 5 atomic % of the titanium atoms.

1 Claim, 1 Drawing Figure

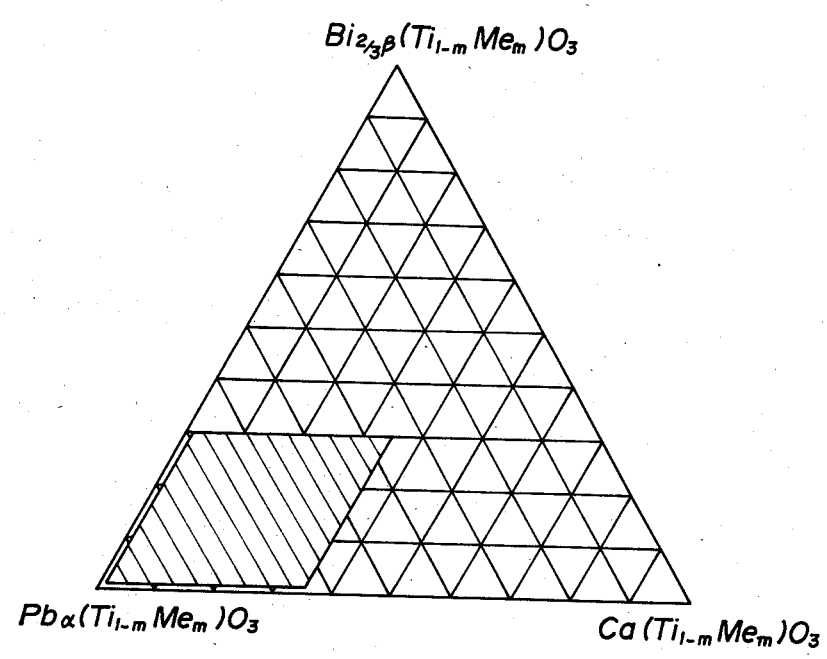

FERROELECTRIC CERAMIC COMPOSITION

BACKGROUND OF THE INVENTION

The present invention relates to a ferroelectric ceramic composition composed, as the basic constituents thereof, of lead titanate, bismuth titanate and calcium titanate or, more particularly, to a ferroelectric ceramic material having excellent dielectric, piezoelectric and temperature characteristics useful for manufacturing surface acoustic wave devices, ceramic filters, ceramic resonators, ultrasonic vibrators, pyroelectric devices and the like piezoelectric vibrators, in particular, operating in the high frequency region.

As is known, piezoelectric elements are widely used in recent years as a surface acoustic wave device, ceramic filter, ceramic resonator, ultrasonic vibrator, pyroelectric sensor and the like and the fields of their applications are rapidly expanding. Along with such an expansion of the application fields, the strictness in the requirements for the performance of piezoelectric devices is growing in diversified respects and it is eagerly desired to develop a piezoelectric material having further improved characteristics. Recently, in particular, piezoelectric devices usable in the high frequency region are under development so that it is desired to develop a material having not only excellent piezoelectric properties but also excellent dielectric characteristics. For example, the requirements for the materials of surface acoustic wave devices include a large electromechanical coupling factor, small temperature coefficient of the surface wave velocities or the delay time and small dielectric constant when the material is to be used in the high frequency region of 10 MHz or higher.

The piezoelectric materials for surface acoustic devices known and used in the prior art include, for example, single crystals of lithium niobate and lithium tantalate and thin films of zinc oxide as well as various types of piezoelectric ceramics. The piezoelectric ceramic materials among them have great advantages in comparison with other types of the piezoelectric materials in respect of the inexpensiveness and versatility or possibility of obtaining different characteristics by a suitable choice of the chemical composition so that extensive investigations are now under way for the development of these materials. In particular, the efforts are concentrated in the development of the so-called PZT-based ceramics because these materials are characteristic in the excellent piezoelectric performance and the temperature dependency of the properties.

The above mentioned PZT-based ceramics are mainly composed of lead zirconate titanate and the materials practically used in the piezoelectric applications are obtained by the improvement of the lead zirconate titanate with admixture of one or more of oxides of metals such as manganese, chromium, cobalt, iron and the like or by forming a solid solution thereof with a complex oxide such as $Pb(Mg_{\frac{1}{3}}Nb_{\frac{2}{3}})O_3$ and the like.

The PZT-based piezoelectric ceramics are, however, not suitable for the use in the high frequency region because the compositions capable of exhibiting good temperature characteristics usually have dielectric constants as large as 500 to 1200. Accordingly, it is difficult to obtain a PZT-based ceramic substrate for surface acoustic wave devices having an effective dielectric constant of 350 or smaller although investigations are being continued therefor. Therefore, the conventional PZT-based ceramic materials are not free from the problems, when used in the region of higher frequencies, including the impedance mismatch with the external circuit due to the decrease in the input and output impedances of the device and ripples produced in the output waveforms due to the capacitive coupling between the input and output.

On the other hand, lead titanate-based ceramics are known with simultaneous addition or substitution with oxides of rare earth elements and other metals. These ceramics have a dielectric constant of about 150 to 300 which is considerably smaller than in the PZT-based ceramics and the piezoelectric properties thereof are also relatively good while they are also not free from their own disadvantages that the sintering behavior thereof is somewhat poor and a large-sized ceramic body can hardly be obtained and that the poling of the material should be performed under extreme conditions of, for example, the temperature of 200° C. and the voltage gradient of 60 kV/cm so that the yield of acceptable products can not always be high enough in the industrial production of the devices. Even if these problems could be solved by some measures such as the addition of special additives, the use of the expensive rare earth compounds is prohibitive of the commercialization of the products.

SUMMARY OF THE INVENTION

An object of the present invention is therefore to provide a novel piezoelectric device having excellent characteristics suitable for the applications in the high frequency region without the above described problems and disadvantages in the prior art materials.

Another object of the invention is to provide a piezoelectric ceramic material basically composed of lead titanate, bismuth titanate and calcium titanate having excellent dielectric, piezoelectric and temperature characteristics in addition to good sinterability and moderate conditions for poling.

Thus, the piezoelectric ceramic composition of the present invention basically composed of lead titanate, bismuth titanate and calcium titanate has a basic chemical composition represented by the formula $$(1-x-y)Pb_\alpha TiO_3 \cdot xBi_{\frac{4}{3}\beta} TiO_3 \cdot yCaTiO_3 \qquad (I)$$

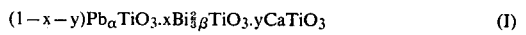

in which x is a positive number in the range from 0.005 to 0.30, y is a positive number in the range from 0.01 to 0.35, $\alpha$ is a positive number in the range from 0.95 to 1.02 and $\beta$ is a positive number in the range from 0.95 to 1.05, the titanium atoms being replaced with from 0.5 to 5 atomic % of manganese atoms, niobium atoms or a combination thereof.

BRIEF DESCRIPTION OF THE DRAWING

The FIGURE is a triangular diagram illustrating the chemical composition of the inventive ceramic materials.

DETAILED DESCRIPTION OF THE PREFERRED EMBODIMENTS

The inventive ferroelectric ceramic composition has a chemical composition represented by the above given formula (I) composed of the three basic components of lead titanate, bismuth titanate and calcium titanate. The proportion of these three components is defined by the values of x and y in the formula. For example, the value of x in the formula, which defines the proportion of the bismuth titanate in the composition, should be in the range from 0.005 to 0.30. When the value of x is smaller than 0.005, the sinterability of the ceramic composition is poor and the shaped ceramic body is sometimes subject to remarkable distortion or deformation in the course of sintering. When the value of x exceeds 0.30, on the other hand, precipitation of a heterophase may take place on the grain boundaries so that the resultant ceramic body has inferior piezoelectric characteristics. Further, the value of y in the formula, which defines the proportion of the calcium titanate in the composition, should be in the range from 0.01 to 0.35. When the value of y is smaller than 0.01, the ceramic material is not suitable as a piezoelectric element due to the inferior piezoelectric and temperature characteristics while, when the value of y exceeds 0.35, the dielectric constant of the ceramic may be 300 or larger so that the usability of the ceramic material in the high frequency region is lost.

The value of $\alpha$, which is the atomic ratio of lead to titanium in the lead titanate, is stoichiometrically 1 although it is subject to variation to some extent depending on the amount of the particular starting material as the lead source in the formulation, the conditions of sintering and the like. In the present invention, no particular adverse influences are caused by the variation in the value of $\alpha$ provided that the value of $\alpha$ is in the range from 0.95 to 1.02. When the value of $\alpha$ is smaller than 0.95, the ceramic composition may have poor piezoelectric characteristics while the sinterability of the ceramic composition is poor with a value of $\alpha$ in excess of 1.02. Similarly, the value of $\beta$ in the formula, which defines the atomic ratio of bismuth to titanium in the bismuth titanate, should be in the range from 0.95 to 1.05. When the value of $\beta$ is smaller than 0.95, the sinterability of the ceramic composition may be poor so that ceramic bodies of large size can hardly be obtained of the composition in addition to a disadvantage of poor piezoelectric characteristics. It should be noted that the value of $\alpha$ is preferably smaller than 1 because of less significant degradation of the ceramic than otherwise.

Characteristically in the inventive ceramic composition, it is essential that the titanium atoms in the composition should be replaced with from 0.5 to 5 atomic % of manganese atoms, from 0.5 to 5 atomic % of niobium atoms or a combination thereof. When this proportion of the substitution is smaller than 0.5 atomic %, dielectric breakdown may sometimes take place in the sintered ceramic body in the course of the poling treatment so that troubles are unavoidable in the manufacturing process. When the substitution exceeds 5 atomic %, on the other hand, the ceramic composition may have poor sinterability and the sintered ceramic body has a remarkably decreased electric resistivity so that the poling treatment can hardly be undertaken and the ceramic body cannot be used as a piezoelectric device. The above mentioned amount of substitution with the manganese or niobium atoms refers to the amount of each of these elements alone and, when the titanium atoms are replaced with a combination of these two elements, for example, the upper limit of substitution with the substituent atoms is doubled to 10 atomic %.

The ceramic body of the present invention can readily be prepared by a conventional method known in the technology of ceramics. For example, the starting materials for the metallic constituents may be the oxides of the respective elements including lead oxide PbO, titanium dioxide $TiO_2$, bismuth oxide $Bi_2O_3$, calcium oxide CaO, manganese dioxide $MnO_2$ and niobium pentoxide $Nb_2O_5$ or any other types of the compounds convertible to the above named oxides by calcination such as hydroxides, carbonates, oxalates, nitrates and the like of the elements. These starting materials each in a powdery form are taken in calculated amounts according to the desired composition of the ceramic material and thoroughly blended in a suitable blending machine such as a ballmill and the powdery blend is first calcined at a temperature in the range from 700° to 900° C. followed by pulverization in a suitable pulverizing machine which also may be a ballmill. The calcined powder obtained in this manner is admixed with water and a small amount of a binder such as polyvinyl alcohol and shaped into a green body by compression molding under a pressure of, for example, 0.5 to 2 tons/cm². The green body is then subjected to sintering for 2 to 4 hours at a temperature in the range from 1150° to 1250° C. to give a ceramic body of the present invention. Although the degree of densification of the sintered body may be satisfactory even by undertaking the process of sintering in atmospheric air according to the conventional procedure, more complete densification may be obtained by undertaking the method of sintering in an oxygen atmosphere using the hot press method, hot isostatic press method and similar methods.

The chemical composition of the inventive ceramic body is illustrated in the triangular diagram of the accompanying drawing, in which each apex of the triangular coordinates corresponds to a composition of the formula $Bi^{2}_{3}\beta(Ti_{1-m}Me_m)O_3$, $Pb_\alpha(Ti_{1-m}Me_m)O_3$ or $Ca(Ti_{1-m}Me_m)O_3$ where Me denotes Mn, Nb or a combination of both and m is a positive number in the range from 0.005 to 0.05.

The ferroelectric ceramic body of the present invention has a dielectric constant as low as 100 to 260 and an electromechanical coupling factor $K_t$ as high as 40 to 55% over a wide range of composition so that it is very useful in a wide field of applications in the high frequency region. In particular, it can be an excellent piezoelectric ceramic substrate for a surface acoustic wave device having a high electromechanical coupling factor $K_s$ of surface acoustic waves and a very low temperature coefficient of the surface wave velocities. Furthermore, the ceramic composition of the invention has good sinterability over a wide range of the chemical composition without affecting the above mentioned excellent piezoelectric, dielectric and temperature characteristics maintained as desired so that large ceramic bodies of high density can readily be obtained by a conventional procedure. The easiness of poling, which can be performed at 80° to 120° C. by a voltage impression of 40 to 60 kV/cm, is also an advantage of the inventive ceramic body in addition to the relatively low cost of production due to the absence of the expensive rare earth compounds in the formulation of the starting materials. These advantages ensure a very high industrial value of the inventive ceramic materials.

In the following, examples are given to illustrate the invention in more detail but not to limit the scope of the invention in any way. In the following examples, the characteristic parameters of the piezoelectric ceramic bodies were determined according to the respective methods described below.

(1) Dielectric and Piezoelectric Characteristics

A ceramic disk having a diameter of 20 mm and a thickness of 1 mm was provided on both surfaces with silver electrodes by baking and subjected to poling under the conditions of a temperature of 80° to 120° C. and a voltage impression of 40 to 60 kV/cm. After standing for 24 hours, the dielectric constant $\epsilon_{33}T$ was measured at a frequency of 1 kHz and the electromechanical coupling factor $K_t$ was determined in the direction of thickness according to the reference circuit method specified in I.R.E.

(2) Surface Acoustic Wave Characteristics

A ceramic disk having a diameter of 50 mm and a thickness of 1 mm after the poling performed in the same manner as above was mirror-polished on one of the surfaces and a couple of interdigital electrodes were formed on the thus polished surface by the techniques of the vapor deposition of aluminum and etching to serve as the electrodes for the measurements of the surface acoustic wave characteristics. The surface acoustic electromechanical coupling factor $K_s$ was obtained by use of the Smith's equivalent circuit with the admittance of the interdigital electrodes.

The temperature coefficient of the center frequency TCF of the filter was also determined for the evaluation of the temperature characteristics.

Example 1 (Samples No. 1 to No. 27) and Comparative Example 1 (Samples No. 28 to No. 35).

Powders of lead oxide PbO, titanium dioxide $TiO_2$, bismuth oxide $Bi_2O_3$, calcium carbonate $CaCO_3$, manganese dioxide $MnO_2$ and niobium pentoxide $Nb_2O_5$ were taken each in a calculated amount and thoroughly blended in a ballmill and the powdery blend was calcined for 2 hours at 900° C. followed by the pulverization of the calcined material in a ballmill. The thus obtained powder was admixed with a small amount of polyvinyl alcohol as the binder and shaped into a green body by compression molding under a pressure of 2 tons/cm². The green body was subjected to sintering at a temperature in the range from 1150° to 1220° C. for 3 hours to give a piezoelectric ceramic body.

Several characteristic parameters of these piezoelectric ceramic bodies obtained in this manner with varied formulations of the starting materials are shown in Table 1 for Example 1 and for Comparative Example 1 together with the formulation for each of the preparations.

In this table, the formulation of each ceramic composition is given by the values of x, y and m and the kind of the element denoted by Me in the formula $(Pb_{1-x-y}Bi^{2/3}_xCa_y)(Ti_{1-m}Me_m)O_3$ which is a conversion of the formula (I) assuming that the values of $\alpha$ and $\beta$ in the formula are each equal to 1. The symbol Me denotes Mn, Nb or both.

TABLE 1

| Sample No. | (Pb$_{1-x-y}$Bi$^{2/3}_x$Ca$_y$)(Ti$_{1-m}$Me$_m$)O$_3$ | | | | $\epsilon_{33}T$ | $K_t$ % | $K_s$ % | TCF, p.p.m./°C. |
|---|---|---|---|---|---|---|---|---|
| | x | y | Me | e | | | | |
| 1 | 0.005 | 0.05 | Mn | 0.02 | 109 | 42.6 | 12 | −35 |
| | | | Nb | 0.03 | | | | |
| 2 | 0.005 | 0.10 | Mn | 0.02 | 120 | 44.3 | 13 | −24 |
| | | | Nb | 0.03 | | | | |
| 3 | 0.005 | 0.20 | Mn | 0.02 | 149 | 51.2 | 17 | 19 |
| | | | Nb | 0.30 | | | | |
| 4 | 0.005 | 0.30 | Mn | 0.02 | 218 | 50.2 | 16 | −4 |
| | | | Nb | 0.03 | | | | |
| 5 | 0.03 | 0.01 | Mn | 0.02 | 106 | 40.5 | 10 | −68 |
| 6 | 0.03 | 0.05 | Mn | 0.02 | 117 | 42.2 | 12 | −58 |
| 7 | 0.03 | 0.10 | Mn | 0.02 | 128 | 43.8 | 13 | −47 |
| 8 | 0.03 | 0.15 | Mn | 0.02 | 140 | 48.9 | 16 | −32 |

TABLE 1-continued

| Sample No. | (Pb$_{1-x-y}$Bi$^{2/3}_x$Ca$_y$)(Ti$_{1-m}$Me$_m$)O$_3$ | | | | $\epsilon_{33}T$ | $K_t$ % | $K_s$ % | TCF, p.p.m./°C. |
|---|---|---|---|---|---|---|---|---|
| | x | y | Me | e | | | | |
| 9 | 0.03 | 0.20 | Mn | 0.02 | 157 | 50.8 | 17 | −4 |
| | | | Nb | 0.03 | | | | |
| 10 | 0.03 | 0.25 | Mn | 0.02 | 187 | 54.2 | 19 | 19 |
| | | | Nb | 0.02 | | | | |
| 11 | 0.03 | 0.30 | Mn | 0.02 | 214 | 54.4 | 19 | 4 |
| | | | Nb | 0.015 | | | | |
| 12 | 0.03 | 0.35 | Mn | 0.02 | 259 | 54.8 | 19 | −21 |
| | | | Nb | 0.015 | | | | |
| 13 | 0.10 | 0.10 | Mn | 0.02 | 153 | 42.5 | 12 | −21 |
| 14 | 0.10 | 0.20 | Mn | 0.02 | 195 | 47.3 | 15 | 18 |
| | | | Nb | 0.03 | | | | |
| 15 | 0.10 | 0.30 | Mn | 0.02 | 242 | 51.5 | 17 | −7 |
| | | | Nb | 0.03 | | | | |
| 16 | 0.15 | 0.10 | Mn | 0.02 | 141 | 44.6 | 13 | −33 |
| | | | Nb | 0.02 | | | | |
| 17 | 0.15 | 0.20 | Mn | 0.02 | 165 | 49.6 | 16 | 11 |
| | | | Nb | 0.02 | | | | |
| 18 | 0.15 | 0.30 | Mn | 0.02 | 263 | 49.3 | 16 | −52 |
| | | | Nb | 0.02 | | | | |
| 19 | 0.30 | 0.10 | Mn | 0.02 | 154 | 41.3 | 11 | −58 |
| | | | Nb | 0.03 | | | | |
| 20 | 0.30 | 0.20 | Mn | 0.02 | 168 | 48.4 | 16 | −15 |
| | | | Nb | 0.03 | | | | |
| 21 | 0.30 | 0.30 | Mn | 0.02 | 236 | 47.7 | 15 | −52 |
| | | | Nb | 0.02 | | | | |
| 22 | 0.03 | 0.30 | Mn | 0.005 | 192 | 52.0 | 17 | −5 |
| 23 | 0.03 | 0.30 | Nb | 0.005 | 204 | 53.1 | 18 | 20 |
| 24 | 0.03 | 0.30 | Nb | 0.03 | 248 | 54.2 | 19 | 14 |
| 25 | 0.03 | 0.30 | Mn | 0.03 | 234 | 53.2 | 18 | −20 |
| | | | Nb | 0.05 | | | | |
| 26 | 0.10 | 0.20 | Mn | 0.02 | 182 | 51.2 | 17 | −31 |
| | | | Nb | 0.05 | | | | |
| 27 | 0.03 | 0.30 | Mn | 0.05 | 223 | 50.8 | 16 | 7 |
| | | | Nb | 0.03 | | | | |
| 28 | 0.001 | 0.30 | Mn | 0.02 | 184 | 28.4 | — | — |
| 29 | 0.40 | 0.20 | Mn | 0.02 | 156 | 19.4 | — | — |
| 30 | 0.03 | 0.005 | Mn | 0.02 | 105 | 25.8 | −5 | −128 |
| 31 | 0.03 | 0.40 | Mn | 0.02 | 463 | 55.1 | 20 | −79 |
| | | | Nb | 0.015 | | | | |
| 32 | 0.03 | 0.30 | Mn | 0.001 | 198 | 28.5 | — | — |
| 33 | 0.03 | 0.30 | Nb | 0.001 | 202 | 34.4 | — | — |
| 34 | 0.10 | 0.20 | Mn | 0.07 | 162 | — | — | — |
| 35 | 0.10 | 0.20 | Nb | 0.07 | 192 | — | — | — |

As is clear from Table 1, the ferroelectric ceramic bodies of the invention have a low dielectric constant of about 100 to 260 over a wide range of the varied formulations and the electromechanical coupling factors thereof are as high as 40 to 55%. The inventive ferroelectric ceramic bodies imparted with these excellent characteristics can exhibit full usefulness not obtained in the prior art when they are used as a piezoelectric device usable in the high frequency region.

When the inventive ferroelectric ceramic bodies are used as a surface acoustic wave device, in particular, a great advantage is obtained by virtue of the very high surface acoustic wave electromechanical coupling factor $K_s$ which sometimes approximates to 20% as in Samples Nos. 10, 11, 12 and 24. Furthermore, it is readily understood that advantages are obtained of the extremely low values of the temperature characteristic TCF of the inventive ceramic bodies in general indicated in Table 1 when comparison is made with the value of −70 p.p.m./°C. in the lithium niobate single crystals currently on use. The value in the inventive ceramic bodies can be as small as −10 to +10 p.p.m./°C. when an appropriate formulation is used of the starting materials as is evidenced by the results of the Samples Nos. 4, 9, 11, 15 and 22.

It is usual in the mass production of surface acoustic wave devices that the piezoelectric material is first shaped in a form of a disk or square plate having a diameter or a length of a side of 50 mm or larger and a number of the devices are formed thereon at one time followed by cutting into the individual devices. One of the essential conditions to make such a process possible is the manufacture of large ceramic plates with stability. In addition, the conditions of poling should be moderate as far as possible in order to increase the percentage of the yield of acceptable products in the mass production. The ferroelectric ceramic bodies of the present invention are particularly advantageous in respect of these requirements because, as is understood from the above description, all of the specimens used for the measurement of the surface acoustic wave characteristics had a diameter of 50 mm indicating the easiness of preparing such a large ceramic body without particular problems and the outstandingly moderate conditions of poling including the temperature of 80° to 120° C. and voltage impression of 40 to 60 kV/cm in comparison with the conditions for the conventional lead titanate-based materials.

In Comparative Example 1, the Sample No. 28 was prepared with a formulation of which the value of x was smaller than 0.005 so that the ceramic composition was not suitable for the preparation of a large ceramic body due to the poor sinterability to cause remarkable distortion of the green body in the course of sintering. The Sample No. 29, on the other hand, was prepared with the value of x larger than 0.30 and the piezoelectric characteristics were poor as is shown in Table 1 due to the precipitation of a heterophase on the grain boundaries.

As is understood from Table 1, furthermore, a value of y smaller than 0.01 is disadvantageous as in Sample No. 30 due to the poor piezoelectric and temperature characteristics though with an advantageously low dielectric constant while a value of y larger than 0.35 as in Sample No. 31 causes a remarkable increase in the dielectric constant up to 400 or larger and increase in the temperature coefficient up to $-70$ p.p.m./°C. or larger. When the value of m is smaller than 0.005 as in Samples No. 32 and No. 33, dielectric breakdown sometimes takes place in the ceramic body during the poling to cause cracking of the ceramic body in each case of manganese and niobium as the element of Me. No satisfactory piezoelectric characteristics can be obtained as in Samples No. 32 and No. 33 by undertaking the poling treatment under a decreased voltage with an object to avoid dielectric breakdown. When the value of m exceeds 0.05 as in Samples No. 34 and No. 35, on the other hand, the electric resistivity of the ceramic body is decreased so that the poling is unavoidably incomplete due to the electric current leaking through the ceramic body during the treatment.

Example 2 and Comparative Example 2.

The procedure for the preparation of the ferroelectric ceramic bodies was substantially the same as in Example 1 excepting the changes in the formulation of the starting materials corresponding to the formula of $$(Pb_{0.77\alpha}Bi_{0.02\beta}Ca_{0.20})(Ti_{0.95}Mn_{0.02}Nb_{0.03})O_3$$

with varied values of $\alpha$ and $\beta$. This formula corresponds to x=0.03, y=0.20 and m=0.05 as a total of the partial values of 0.02 for manganese and 0.03 for niobium in the general formula $$[Pb_{(1-x-y)\alpha}Bi^a_{\frac{2}{3}\beta(x)}Ca_y](Ti_{1-m}Me_m)O_3$$

and the characteristic parameters of the ceramic bodies were determined to give the results shown in Table 2.

TABLE 2

| Sample No. | α | β | ε₃₃T | Kt, % | Ks, % | TCF, p.p.m./°C. |
|---|---|---|---|---|---|---|
| 1 | 1.02 | 1.00 | 159 | 50.1 | 16 | 3 |
| 2 | 1.00 | 1.00 | 157 | 50.8 | 17 | −4 |
| 3 | 0.98 | 1.00 | 156 | 50.8 | 17 | −5 |
| 4 | 0.95 | 1.00 | 153 | 51.2 | 17 | −8 |
| 5 | 1.00 | 1.05 | 155 | 51.0 | 17 | 7 |
| 6 | 1.00 | 0.98 | 157 | 50.6 | 17 | −5 |
| 7 | 1.00 | 0.95 | 162 | 50.4 | 16 | −10 |
| 8 | 1.02 | 1.05 | 156 | 50.5 | 16 | 8 |
| 9 | 0.95 | 0.95 | 164 | 50.7 | 17 | −14 |
| 10 | 1.04 | 1.00 | — | — | — | — |
| 11 | 0.92 | 1.00 | 149 | 38.6 | 10 | −52 |
| 12 | 1.00 | 1.08 | 147 | 44.2 | 13 | −76 |
| 13 | 1.00 | 0.92 | 166 | 42.3 | — | — |

In Table 2, the Sample No. 10 could not be sintered due to the improper formulation of the components and the Sample No. 13 exhibited a large distortion so that the values of $K_s$ and TCF could not be obtained.

As is understood from Table 2, the sinterability of the ceramic composition is poor when the value of $\alpha$ is smaller than 0.95 while the piezoelectric characteristics of the ceramic body are rapidly degraded as the value of $\alpha$ is increased over 1.02. When the value of $\beta$ is smaller than 0.95, the sintered body is subject to a large distortion so that large ceramic bodies can hardly be obtained with such a formulation of the ceramic composition in addition to a disadvantage of degraded piezoelectric characteristics while, when the value of $\beta$ exceeds 1.05, the ceramic bodies may have relatively poor piezoelectric and temperature characteristics.

What is claimed is:

1. A ferroelectric ceramic body consisting essentially of lead titanate, bismuth titanate and calcium titanate as the basic components and having a chemical composition represented by the formula $$(1-x-y)Pb_\alpha TiO_3.xBi^a_{\frac{2}{3}\beta}TiO_3.yCaTiO_3,$$

in which x is a positive number in the range from 0.005 to 0.30, y is a positive number in the range from 0.01 to 0.35, $\beta$ is a positive number in the range from 0.95 to 1.02 and $\beta$ is a positive number in the range from 0.95 to 1.05, the atoms of titanium being replaced with manganese atoms, niobium atoms or a combination thereof in such amounts that the total of manganese atoms and niobium atoms is up to 10 atomic percent, and the range of the amounts of each of the manganese atoms and niobium atoms is from 0.5 to 5 atomic percent.

* * * * *